(12) United States Patent
Lin et al.

(10) Patent No.: US 8,148,246 B2
(45) Date of Patent: Apr. 3, 2012

(54) METHOD FOR SEPARATING SEMICONDUCTOR LAYER FROM SUBSTRATE

(75) Inventors: Wen Yu Lin, Taichung County (TW); Shih Cheng Huang, Hsinchu (TW); Po Min Tu, Chiayi County (TW); Chih Peng Hsu, Tainan County (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 442 days.

(21) Appl. No.: 12/437,058

(22) Filed: May 7, 2009

(65) Prior Publication Data

US 2009/0280625 A1  Nov. 12, 2009

(30) Foreign Application Priority Data

May 9, 2008  (TW) ................................ 97117099 A

(51) Int. Cl.
*H01L 21/20* (2006.01)

(52) U.S. Cl. ........ 438/492; 438/694; 438/703; 438/745; 438/458; 216/96; 257/E21.12

(58) Field of Classification Search ................. 438/458, 438/459, 977, 694, 745, 752, 753, 46, 406, 438/492, 703; 216/99, 96; 257/E21.09, E21.12
See application file for complete search history.

(56) References Cited

U.S. PATENT DOCUMENTS

| | | | |
|---|---|---|---|
| 4,448,636 A | | 5/1984 | Baber et al. |
| 6,071,795 A | | 6/2000 | Cheung et al. |
| 6,613,610 B2 | * | 9/2003 | Iwafuchi et al. ............ 438/128 |
| 6,740,604 B2 | | 5/2004 | Kelly et al. |
| 6,913,985 B2 | * | 7/2005 | Ogihara et al. ............. 438/462 |
| 7,828,986 B2 | * | 11/2010 | Cheng et al. ................. 216/58 |
| 7,892,940 B2 | * | 2/2011 | Edelstein et al. ............ 438/421 |
| 7,960,195 B2 | * | 6/2011 | Maeda et al. ................. 438/29 |
| 2004/0124092 A1 | * | 7/2004 | Black et al. ................. 205/363 |
| 2009/0035668 A1 | * | 2/2009 | Breyta et al. ................. 430/18 |
| 2009/0280625 A1 | * | 11/2009 | Lin et al. ................... 438/478 |
| 2010/0243987 A1 | * | 9/2010 | Liu et al. ................... 257/13 |
| 2011/0111590 A1 | * | 5/2011 | Edelstein et al. ............ 438/643 |

OTHER PUBLICATIONS

Chinese Office Action dated Aug. 24, 2010 for 200810097860.6, which is a Chinese counterpart application.
"Laser-Induced Dry Lift-off Process", Yong-Feng Lu et al., Jpn. J. Appl. Phys. vol. 34, 1995, pp. 1669-1670.
"Excimer-Laser Removal of SiO2 Patterns from GaAs Substrates", Yong-Feng Lu et al., Jpn. J. Appl. Phys., vol. 33, 1994, pp. 324-327.
"Extreme selectivity in the lift-off of epitaxial GaAs films", Eli Yablonovitch et al., Appl. Phys. Lett. 51 (26), Dec. 28, 1987, pp. 2222-2224.
"Photoassisted dry etching of GaN", R.T. Leonard et al., Appl. Phys. Lett. 68, Feb. 5, 1996, pp. 794-796.
Huang et al., entitled "Fabrication of GaN-based nanorod light emitting diodes using self-assemble nickel nano-mask and inductively coupled plasma reactive ion etching," published in Materials Science and Engineering B 113 (2004) 125-129.

* cited by examiner

*Primary Examiner* — Mary Wilczewski
(74) *Attorney, Agent, or Firm* — Altis Law Group, Inc.

(57) ABSTRACT

A method for separating a semiconductor from a substrate is disclosed. The method comprises the following steps: forming a plurality of columns on a substrate; epitaxially growing a semiconductor on the plurality of columns; and injecting etching liquid into the void among the plurality of columns so as to separate the semiconductor from the substrate. The method of this invention can enhance the etching efficiency of separating the semiconductor from the substrate and reduce the fabrication cost because the etching area is increased due to the void among the plurality of columns. In addition, the method will not confine the material of the above-mentioned substrate.

13 Claims, 9 Drawing Sheets

METHOD FOR SEPARATING SEMICONDUCTOR LAYER FROM SUBSTRATE

BACKGROUND OF THE INVENTION

1. Field of the Invention

The present invention relates to a method of a photoelectronic device for separating a semiconductor layer from a substrate, and relates more particularly to a method for separating a semiconductor from a substrate by using wet-etching process.

2. Description of the Related Art

The word epitaxy derives from a combination of two Greek words, epi ("upon") and taxis ("ordered"), meaning that one material is arranged in an ordered manner upon another material. In the semiconductor industry, the epitaxial growth process is used during manufacture for depositing a film material upon a substrate. The epitaxial growth process is different from crystal growth by using the Czochralski process. The epitaxial growth processes can be categorized into three categories: (1) liquid phase epitaxy (LPE) process; (2) vapor phase epitaxy (VPE) process; (3) molecular beam epitaxy (MBE) process. The VPE process can be further categorized according to reaction type into (a) chemical vapor deposition (CVD) and (b) physical vapor deposition (PVD). By using the epitaxial growth process, a semiconductor film can be grown by controlling reaction parameters to have an amorphous crystal structure, a poly crystal structure or a single crystal structure, and dopants can be directly added during the process, eliminating the need for diffusion and ion implantation processes.

However, during the epitaxial process, a semiconductor layer may have lattice dislocation and thermal stress issues because the semiconductor layer and its heterosubstrate have different lattice constants and coefficients of thermal expansion. Conventionally, substrates used for eptiaxial processes usually have characteristics that are insufficient or unsuitable for the later processing steps of manufacturing an optoelectronic device or for the application of semiconductor components. Therefore, many techniques have been developed for separating semiconductor layers and attempting to solve said problem.

For example, a paper by Yablonovitch, et al. published in Appl. Phys. Lett. 51, 2222 (1987) proposes to implement AlAs sacrificial layers in the GaAs/AlAs material system during the production process, which can then be dissolved by using wet chemical means. This makes it possible to separate layers or structures from the substrate. However, because of the low lateral etching rate, this process is very time-consuming.

U.S. Pat. No. 4,448,636 describes a process for removing metal films from a substrate. First, the metal film is heated by light. An organic sacrificial layer between the substrate and the metal film is vaporized by the heat and allows the metal layer to be removed. Such organic intermediate layers cannot be employed, however, in the epitaxial growth of group III nitrides.

A comparable process has been described for removing silicon dioxide layers from gallium arsenide in Y. F. Lu, Y. Aoyagi, Jpn. J. Appl. Phys. 34, L1669 (1995). In this process, an organic intermediate layer is heated by light absorption and the $SiO_2$ layer is lifted off.

A paper by Y. F. Lu, Y. Aoyagi, published in Jpn. J. Appl. Phys. 33, L324(1994) proposes a method that uses an Excimer laser beam to separate silicon oxide strips from a GaAs layer.

Specifically for group III nitrides, Leonard and Bedair, Appl. Phys. Lett. 68, 794 (1996) describe the etching of GaN with a laser pulse under HCl gas so as to perform a separation process.

Although many separation methods, including the above, have been introduced, such methods suffer from deficiencies such as high cost, limited availability of material required by the methods, low efficiency, and excessive destruction of semiconductor structures. Therefore, a new method is required to overcome the limitations of prior methods.

SUMMARY OF THE INVENTION

In accordance with the Description of the Related Art section and to meet the requirements of the semiconductor industry, the present invention proposes a method for separating a semiconductor from a substrate, which can solve the issues of conventional methods.

One objective of the present invention is to provide a method for separating a semiconductor from a substrate. The method initially disposes a mask on a substrate, and then the mask is annealed to form a plurality of covering portions. Next, a plurality of columns are formed by etching process through creation of voids among the covering portions. Finally, the mask is separated from the substrate. Particularly, a substrate having a column matrix is formed, wherein the plurality of columns constitute the column matrix.

Thereafter, a semiconductor layer is epitaxially grown upon the column matrix, and then the semiconductor layer is separated from the substrate by wet etching the column matrix such that a free-standing bulk substrate or film is obtained.

BRIEF DESCRIPTION OF THE DRAWINGS

The invention will be described according to the appended drawings in which.

DETAILED DESCRIPTION OF THE INVENTION

Figure 1:
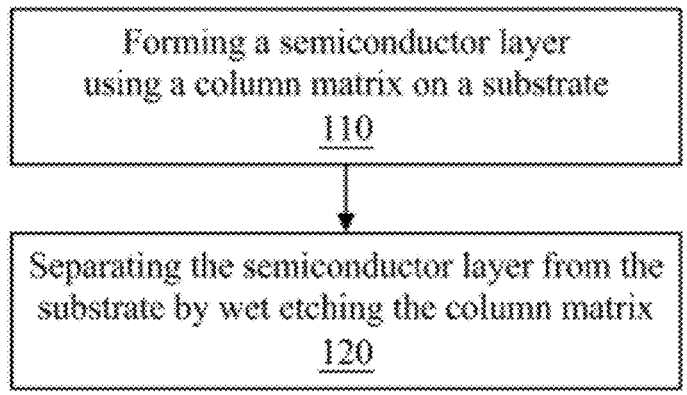
FIG. 1 is a flow chart showing a process for separating a semiconductor layer from a substrate according to the first embodiment of the present invention.

One aspect of the present invention proposes a method for separating a semiconductor from a substrate. In order to provide a thorough understanding of the present invention, a detailed description of a number of method steps and components is provided below. The practice of the present invention is not limited to any one particular implementation of separating a semiconductor from a substrate that is familiar to one skilled in the art. On the other hand, components or method steps which are well-known are not described in detail. A preferred embodiment of the present invention will be described in detail. However, in addition to the preferred embodiment described, other embodiments can be broadly employed, and the scope of the present invention is not limited by any of the embodiments, but should be defined in accordance with the following claims and their equivalent.

In the development of increasingly efficient methods to fabricate optoelectronic devices, the process of separating a semiconductor layer from a substrate continues to become more important, and therefore many techniques for separating semiconductor layers have been introduced. These include, for example, electromagnetic radiation methods that use a laser beam penetrating a substrate and incident on the interface between the substrate and a semiconductor layer, or methods that directly remove the interface layer between the substrate and the semiconductor layer by etching process under high temperature environment, separating a semiconductor layer from a substrate so as to obtain a free-standing bulk substrate or film which can further be used to fabricate a thin film device or a vertical conductive device.

For further example, U.S. Pat. No. 6,740,604 discloses a method of separating two layers of material from one another. The method directs a laser beam through one semiconductor layer and incident on another semiconductor layer, which absorbs the energy that induces decomposition of the interface between the two semiconductor layers. In order to improve the absorption of the electromagnetic radiation at the interface to be separated, an absorbing layer may be interposed between the semiconductor layers for increasing the electromagnetic radiation absorption efficiency of the interface. If a normal light source is used to produce the above-mentioned electromagnetic radiation, the energy is not strong enough to induce decomposition, and therefore a laser is usually used to decompose two semiconductor layers or a semiconductor layer and a substrate. In addition, the material of the semiconductor layer, and the wavelength and the intensity of the laser beam, shall be cautiously selected. The electromagnetic radiation reaches the interface to be separated and is absorbed sufficiently there to perform the above-mentioned decomposition process.

Similarly, U.S. Pat. No. 6,071,795 discloses a method of separating a thin film of GaN epitaxially grown on a sapphire substrate. The sapphire substrate is laser irradiated with a scanned beam at a wavelength at which sapphire is transparent but the GaN is strongly absorbing. After the laser irradiation, the sample is heated above the melting point of gallium (above 30° C.) to melt the gallium without reintegrating the gaseous nitrogen, and the acceptor substrate and attached GaN thin film are removed from the sapphire growth substrate. However, the laser radiation incident upon the sapphire donor substrate may be 248 nm radiation from a KrF pulsed excimer laser having a pulse width of 38 ns. The above-mentioned method of separating two semiconductor layers or separating a semiconductor layer and a substrate is expensive and must use a transparent substrate for the separation purpose.

In addition to electromagnetic radiation methods, using etching techniques to separate a semiconductor layer from a substrate can lower the cost and has no limitation in material used in semiconductor layer and in the wavelength of electromagnetic radiation. However, conventional etching processes can only be applied on the surface of a semiconductor, so the processing speed is slow.

Therefore, the present invention proposes a method for separating a semiconductor from a substrate, one objective of which is to increase the efficiency of separating a semiconductor layer from a substrate and lower fabrication cost by forming a plurality of columns on a substrate; expitaxially growing a semiconductor on the plurality of columns such that a plurality of voids exist among the plurality of columns so as to increase the etching area. The method initially forms a mask on a substrate, wherein the mask includes a plurality of covering portions that are separated by voids. Next, a plurality of columns are formed by etching the substrate through the mask. Next, a semiconductor is expitaxially grown on the plurality of columns. Finally, the semiconductor layer is separated from the substrate by etching away the plurality of columns.

A method of forming a plurality of columns is disclosed in a paper by Huang et al., entitled "Fabrication of GaN-based nanorod light emitting diodes using self-assemble nickel nano-mask and inductively coupled plasma reactive ion etching," published in Materials Science and Engineering B 113 (2004) 125-129, and the method first forms a mask on a substrate. Next, the mask is annealed by a rapid thermal annealing process to form a plurality of covering portions. At this point, the plurality of covering portions are separated by voids on the substrate. Next, the substrate is etched through the void among the covering portions by an inductively coupled plasma reactive ion etching process such that a plurality of columns are formed. Finally, the mask is separated from the substrate to obtain a substrate with a plurality of columns.

The present invention adopts the method proposed by Huang et al. and thereby provides a method for separating a semiconductor from a substrate. The method is illustrated in FIG. 1, and in Step 110, a semiconductor layer is formed by using the column matrix of a substrate, wherein the semiconductor layer includes any one of or any combination of the following: gallium nitride (GaN), gallium indium nitride (GaInN) and aluminum gallium nitride (AlGaN). In Step 120, the semiconductor layer is separated from the substrate by wet etching the column matrix so as to obtain a free-standing bulk substrate or a film, wherein the column matrix includes a plurality of columns that are separated by voids on the substrate.

Figure 2:
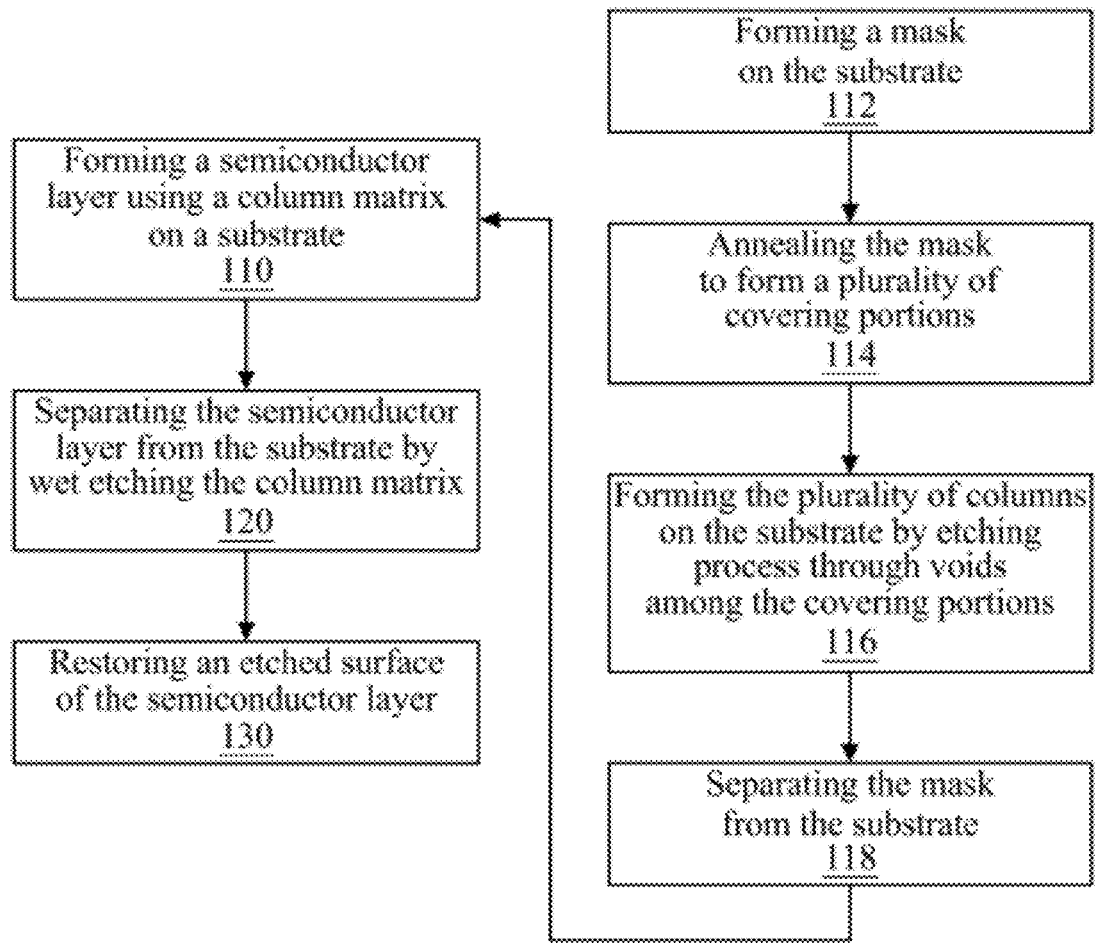
FIG. 2 is a flow chart showing a process for separating a semiconductor layer from a substrate according to the second embodiment of the present invention.

The method of forming the column matrix, which is similar to that proposed by Huang et al., comprises the following steps. In Step 112, a mask is initially formed on a substrate as shown in FIG. 2. In Step 114, the mask is then annealed to form a plurality of covering portions. In Step 116, the substrate is then etched to form a plurality of columns through the voids among the covering portions. In Step 118, the mask is separated from the substrate, and thereafter the process proceeds to Step 110.

Moreover, after the step of separating the mask from the substrate, the method may further comprise Step 130 of recovering the etched surface of the semiconductor layer, wherein the restoration of the etched surface of the semiconductor layer can be performed using any one or any combination of the following processes: dry-etching process, wet-etching process and chemical mechanical polishing process.

According to the paper by Huang et al., the annealing treatment of the mask can be performed by using a rapid thermal annealing process, and then the substrate can be etched out a plurality of columns using inductively coupled plasma reactive ion etching, wherein the preferred rapid thermal annealing temperature is between 800° C. and 900° C. The above-mentioned substrate can be selected from the group consisting of: sapphire, zinc oxide (ZnO), quartz, silicon-based semiconductor material (for example: Si, silicon carbide such as SiC, 6H—SiC, 4H—SiC etc.), Group III-V semiconductor material (for example, GaAs, AlGaAs, GaInAs, AlGaIn As, GaP, AlGaP, GaInP, AlGaInP, GaN, AlGaN, AlGaInN, etc.), and Group II-VI semiconductor material (for example, ZnSe, CdTe, CuInGaSe$_2$, CuInSe$_2$, etc.) It is worth noting that the etching rate ratio between the substrate and the semiconductor layer can be high, such that the separation process can be performed by using wet etching process.

Furthermore, the mask can include a nickel layer or can further include a silicon nitride (Si$_3$N$_4$) layer, wherein the silicon nitride layer can be between the substrate and the nickel layer. Moreover, the mask can be a silver (Ag) layer or a platinum (Pt) layer except that it can be a nickel layer such that using different materials to change the distribution density of the plurality of covering portions can result in different column distribution densities. Additionally, the thickness of the nickel layer, the silver layer or the platinum layer can be between 50 Å and 150 Å; the thickness of the silicon nitride layer can be 2000 Å and 4000 Å; the distribution densities of the plurality of the columns and the plurality of the masking portions are between $2.2 \times 10^9$ and $3 \times 10^{10}$ cm$^{-2}$; and the dimension of the columns matrix is approximately between 50 and 300 nm.

Figure 3:
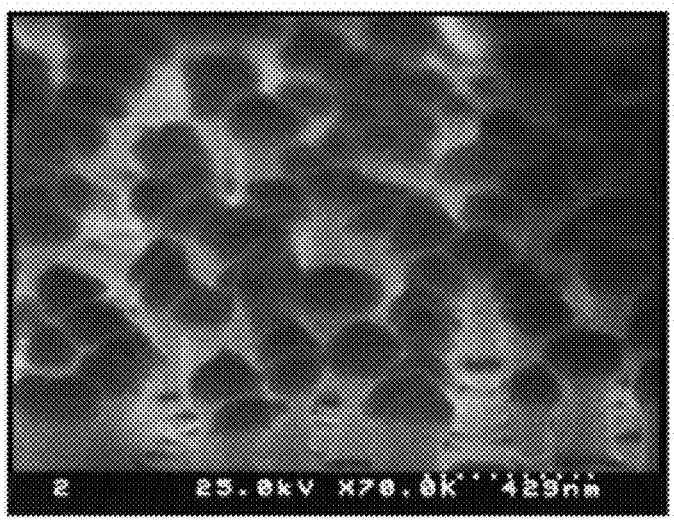
FIG. 3 shows scanning electron microscope photographs of a column matrix according to one embodiment of the present invention.
Figure 3:
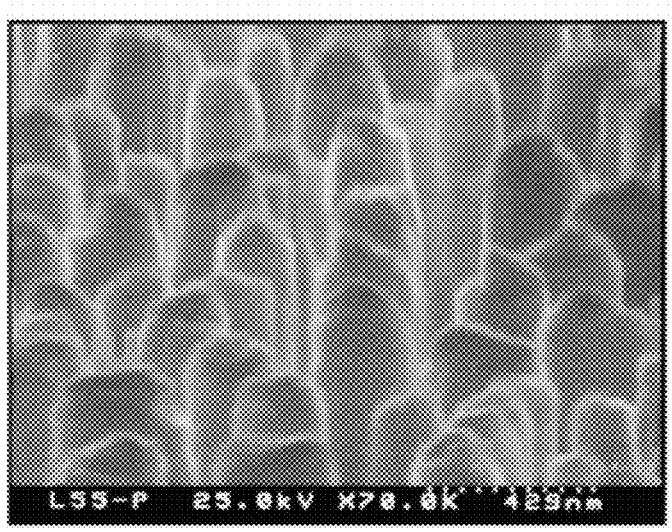
Figure 3:
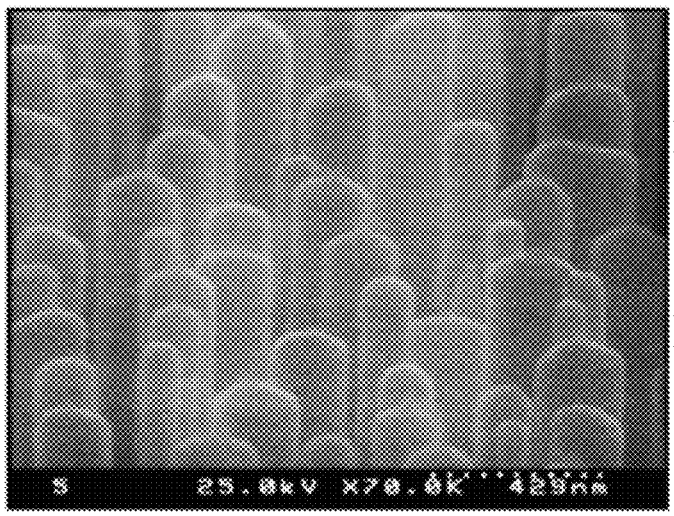
Figure 4:
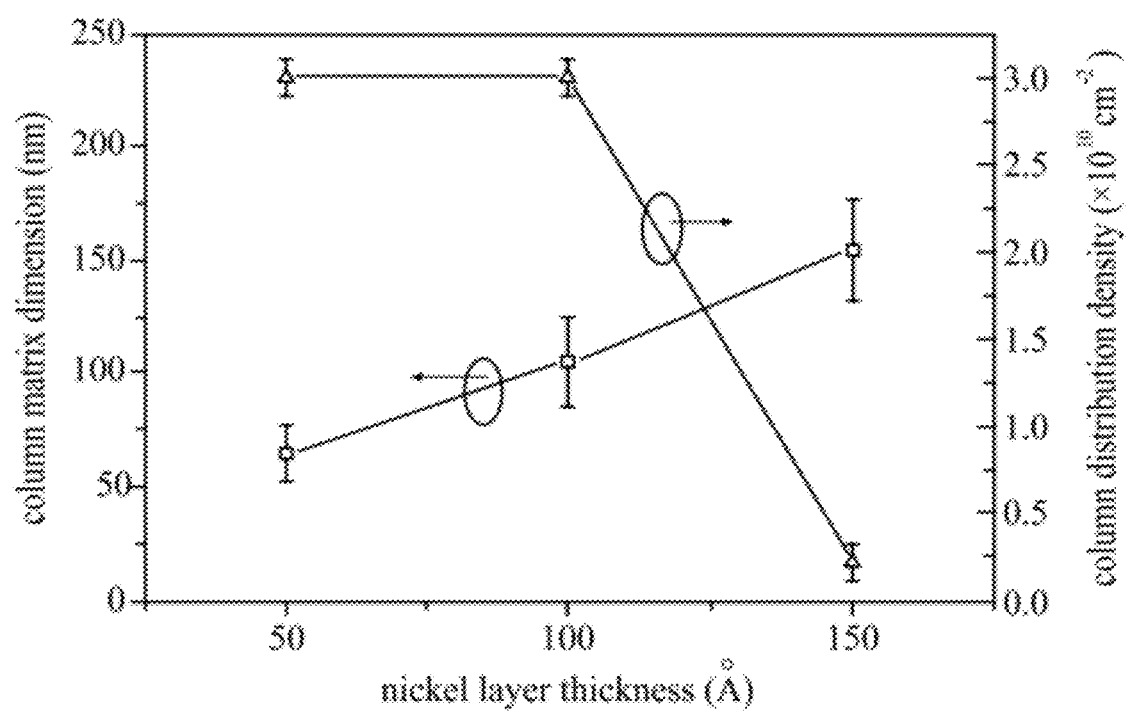
FIG. 4 is a graph showing nickel layer thickness vs. density and dimension of a column matrix according to one embodiment of the present invention.

When the thickness of the silicon nitride layer was 3000 Å, the thicknesses of the nickel layer were 50 Å, 100 Å, and 150 Å; and the rapid thermal annealing temperature was 850° C., the profile, dimensions and distribution densities were as shown in FIG. 3 and FIG. 4. FIG. 3 shows scanning electron microscope photographs of a column matrix according to one embodiment of the present invention. FIG. 4 is a graph showing nickel layer thickness vs. density and dimension of a column matrix according to one embodiment of the present invention. In addition, the dimension of the column matrix means the average diameter of the plurality of the columns. In the etching process used to obtain the column matrix shown in FIG. 3, the flow rate of chlorine gas was 50 sccm, the flow rate of argon gas was 20 sccm, and the etching process was carried out for 3 minutes, at a pressure of 5 mTorr, and with RF power 400 W.

Figure 5:
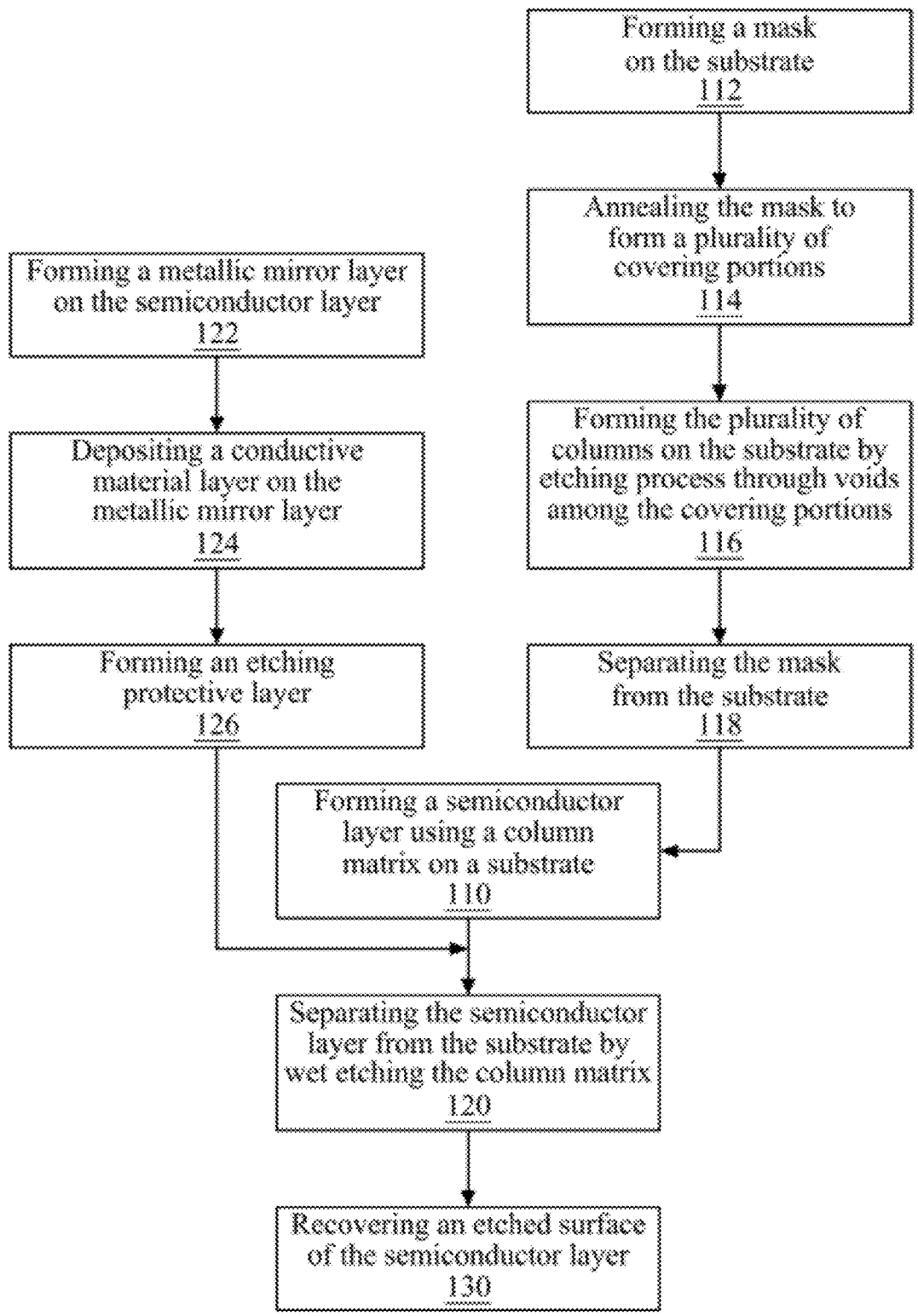
FIG. 5 is a flow chart showing a process for separating a semiconductor layer from a substrate according to the third embodiment of the present invention.
Figure 6:
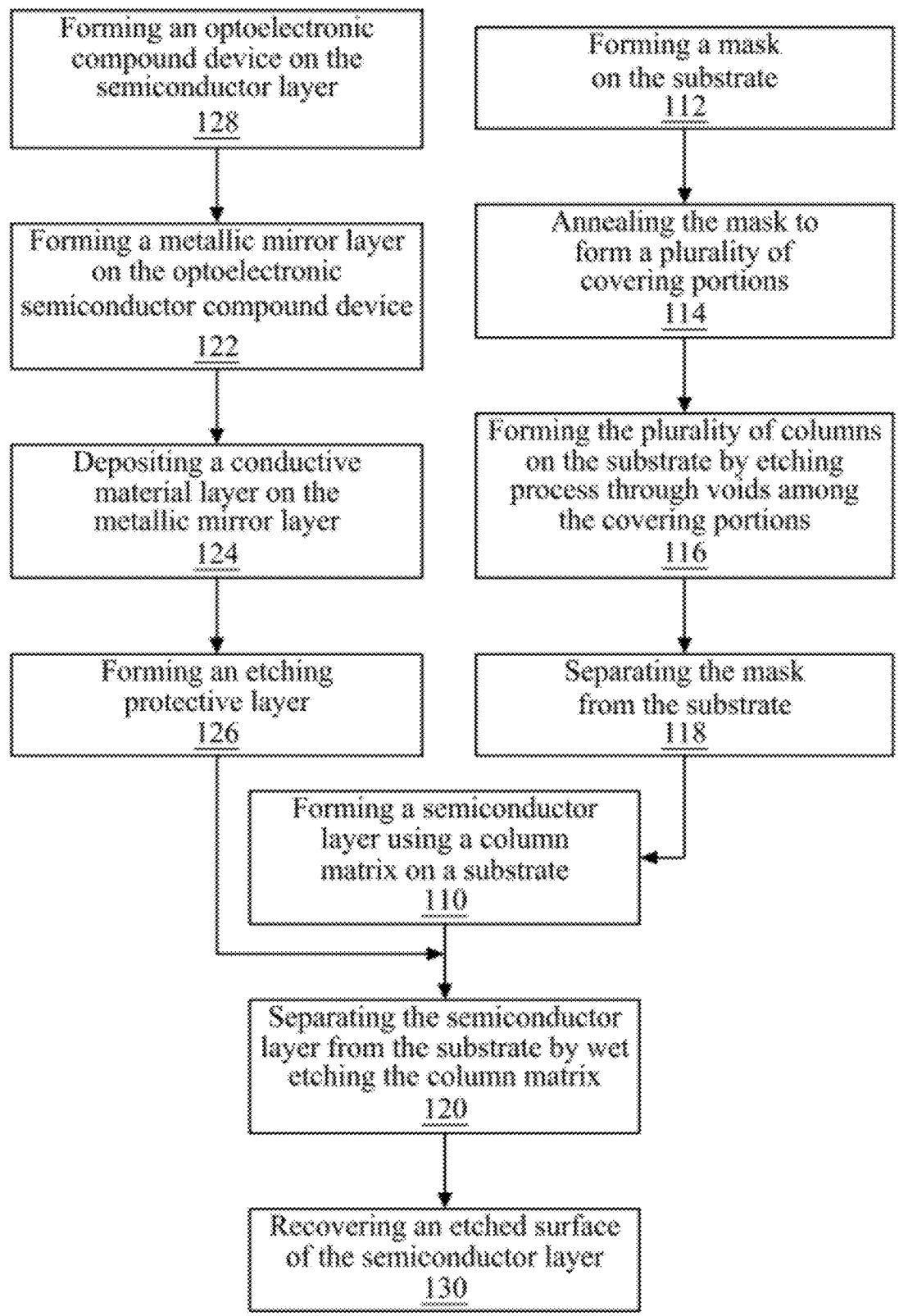
FIG. 6 is a flow chart showing a process for separating a semiconductor layer from a substrate according to the fourth embodiment of the present invention.

In order to conveniently proceed to the method steps of manufacturing an optoelectronic device, the following steps may be performed before the step of separating the semiconductor layer from the column matrix. As shown in FIG. 5, in Step 122, a metallic mirror layer is formed on the semiconductor layer. In Step 124, a conductive material is deposited on the metallic mirror layer. Finally, as shown in Step 126, an etching protective layer is formed, which covers the semiconductor layer, the metallic mirror layer and a conductive material. As shown in FIG. 6, before the step of forming a metallic mirror layer on a semiconductor layer, the method may further comprise Step 128 of forming an optoelectronic compound device on the semiconductor layer such that the optoelectronic compound device is disposed between the metallic mirror layer and the semiconductor layer.

Figure 7:
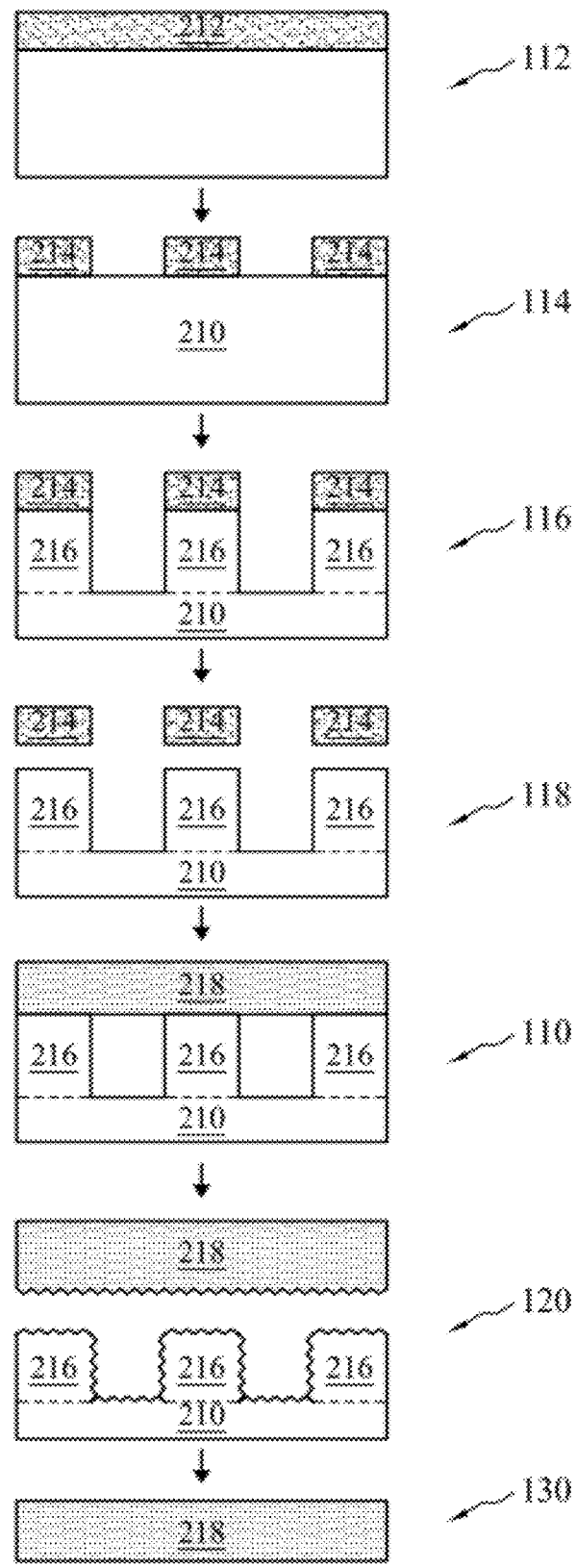
FIG. 7 is a schematic diagram illustrating a process for separating a semiconductor layer from a substrate according to the first embodiment of the present invention.

FIG. 7 shows a schematic diagram illustrating a process for separating a semiconductor from a substrate according to one embodiment of the present invention. In Step 112, a mask is initially formed on a substrate 210. The mask can be a nickel layer 212. In Step 114, the nickel layer 212 is annealed to form a plurality of covering portions 214. In Step 116, the substrate 210 is etched to form a plurality of voids dividing the substrate 210 into a plurality of columns 216 separated by the voids among the plurality of covering portions 214. In Step 118, the nickel layer 212 is separated from the substrate 210.

Figure 8:
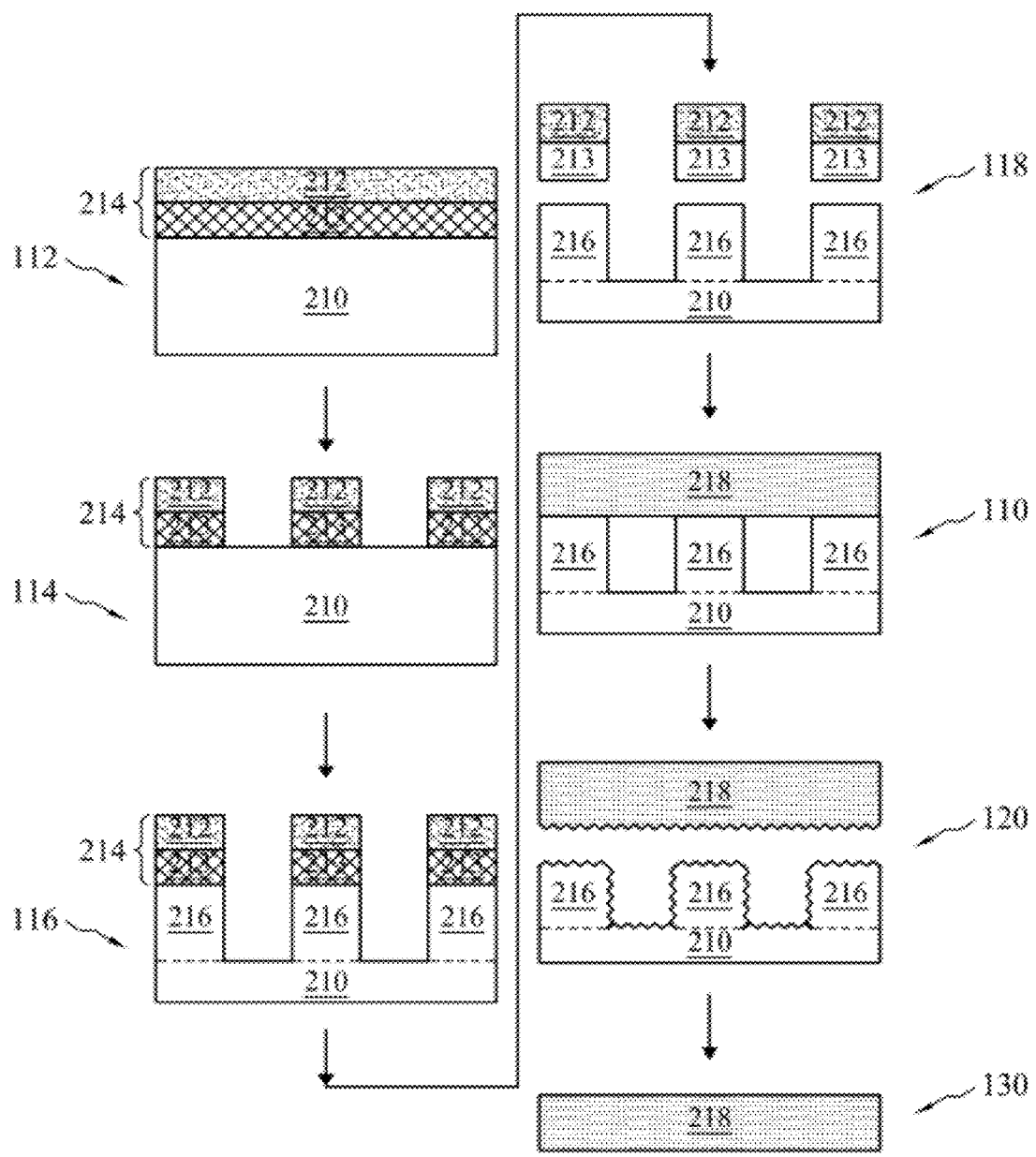
FIG. 8 is a schematic diagram illustrating a process for separating a semiconductor layer from a substrate according to the second embodiment of the present invention.

Referring to FIG. 8, in addition to the nickel layer 212, the mask in Step 112 may further simultaneously include a silicon nitride layer 213 formed between the substrate 210 and the nickel layer 212, and the steps shown in FIG. 7 can still proceed. Because the silicon nitride 213 is bonded with the nickel layer 212, the interface stress of the nickel layer 212 increases such that the migration of nickel atoms is influenced, and the cohesion force of the nickel layer 212 increases. Therefore, the mask composed of the silicon nitride layer 213 and the nickel layer 212 can be assembled into the covering portions with dimensions as disclosed in the paper by Huang et al. after annealing treatment.

Referring to FIGS. 7 and 8 again, in Step 110, a semiconductor layer 218 is formed and supported by the tops of the plurality of the columns 216, and therefore a plurality of voids among the plurality of columns 216 such that the etching area is increased. In Step 120, the etching liquid is injected into the void among the plurality of columns 216 so as to etch the plurality of columns 216, and consequently, the semiconductor layer 218 can be separated from the substrate 210.

Figure 9:
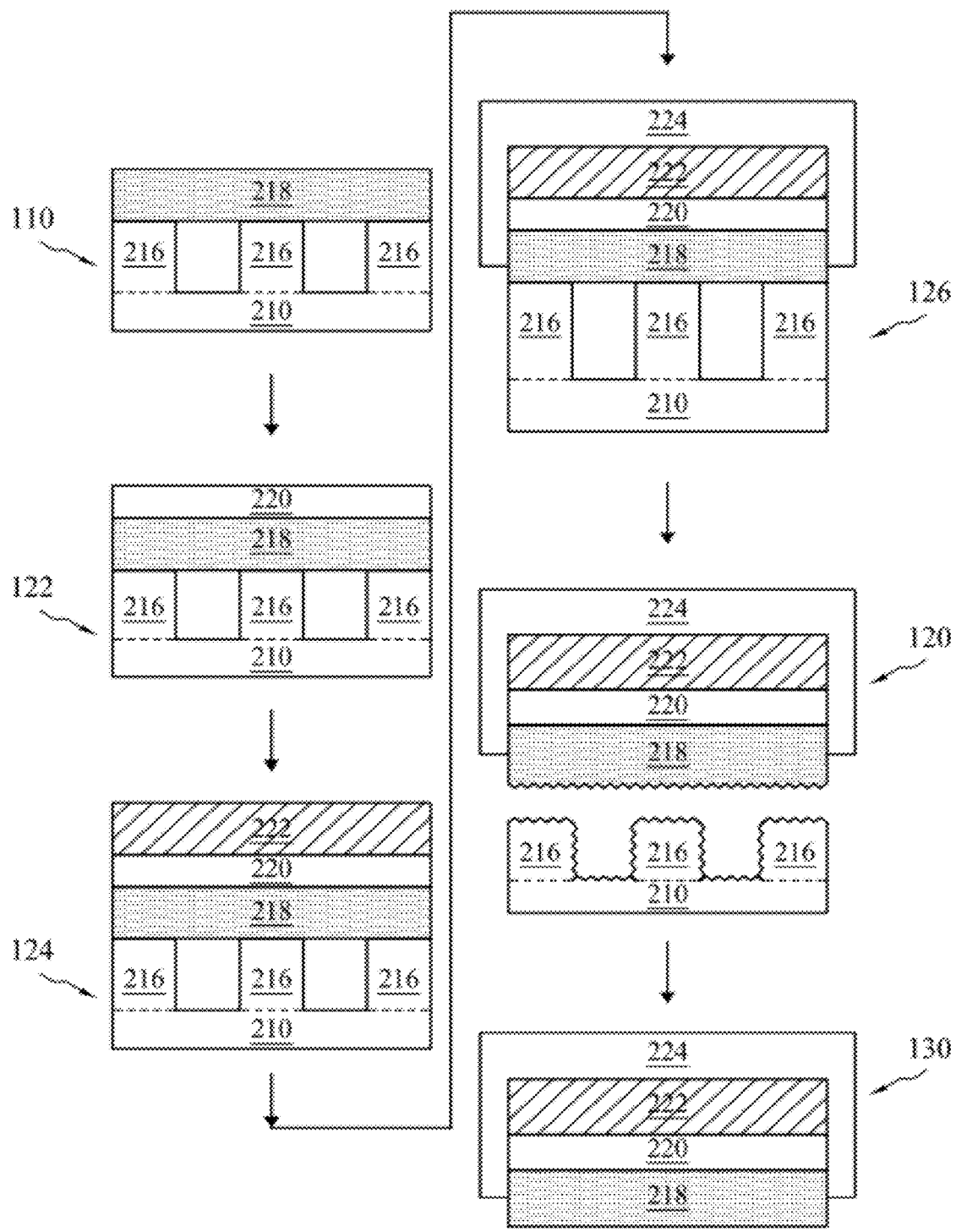
FIG. 9 is a schematic diagram illustrating a process for separating a semiconductor layer from a substrate according to the third embodiment of the present invention.

Referring to FIG. 9, before the step of separating the semiconductor layer 218 from the substrate 210, a metallic mirror layer 220 can be formed on the semiconductor layer 218, as shown in Step 122. In Step 124, a conductive material 222 is deposited on the metallic mirror layer 220. In Step 126, an etching protective layer 224 is then formed to cover the semiconductor layer 218, the metallic mirror layer 220 and the conductive material 222. Finally, as shown in Step 120, the plurality of columns 216 is etched to separate the semiconductor layer 218 from the substrate 210. During the etching of the columns, the semiconductor layer 218, the metallic mirror layer 220 and the conductive material 222 are protected by the etching protective layer 224 so that the structure comprising the semiconductor layer 218, the metallic mirror layer 220 and the conductive material 222 is protected from the etching liquid, and such protection is helpful for manufacturing an optoelectronic from the structure.

Figure 10:
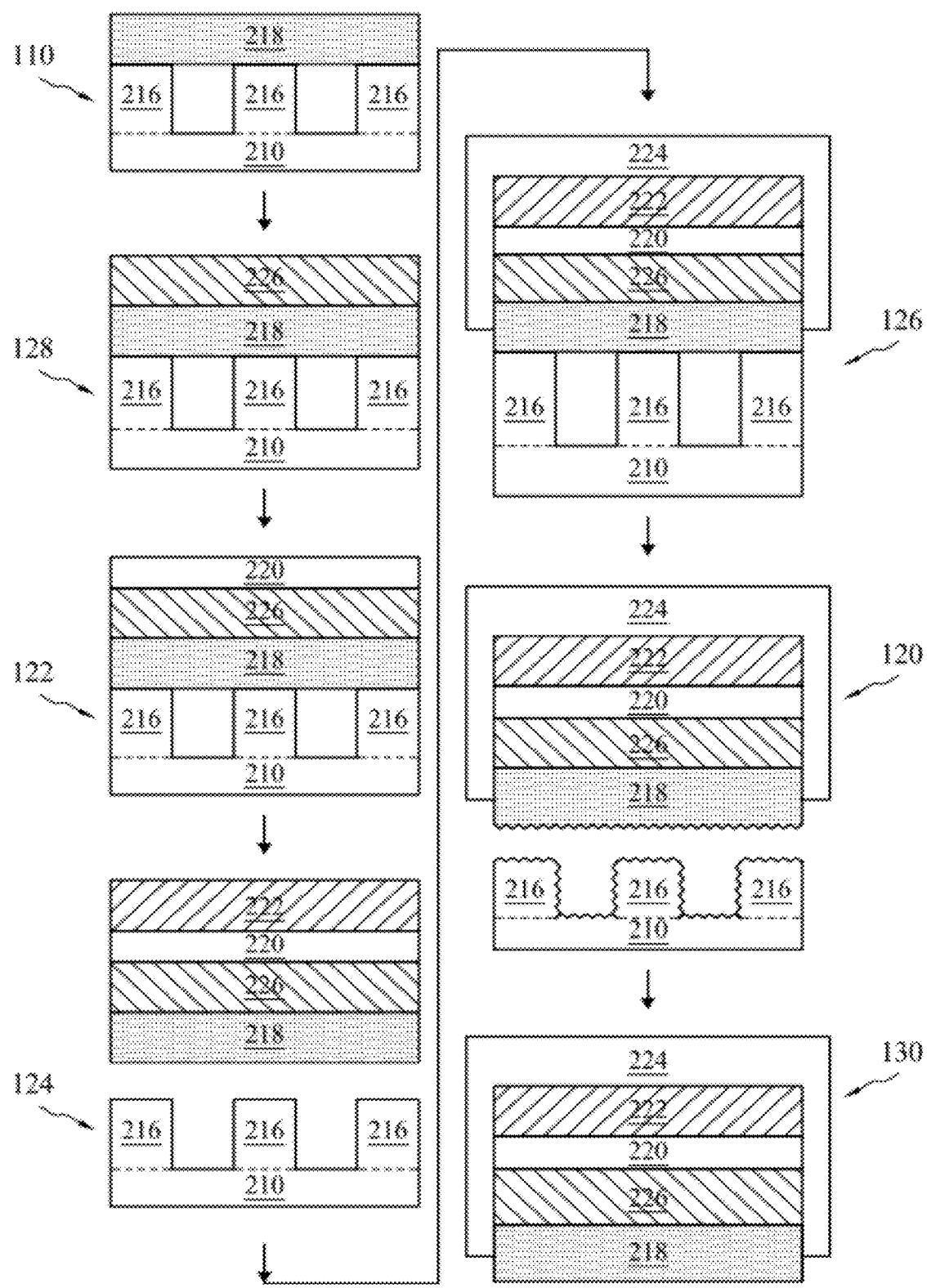
FIG. 10 is a schematic diagram illustrating a process for separating a semiconductor layer from a substrate according to the fourth embodiment of the present invention.

Please refer to FIG. 10. An optoelectronic compound device 226 on the semiconductor layer 218 is shown as in Step 128 and prior to Step 122. In Step 122, a metallic mirror layer 220 is thereafter formed on the optoelectronic compound device 226 so that the optoelectronic compound device 226 is between the metallic mirror layer 220 and the semiconductor layer 218. Next, the process is proceeded as described above.

The invention proposes a method for separating a semiconductor from a substrate, which can lower production costs, does not require a transparent substrate, and moreover does not affect the material of each layer.

The above-described embodiments of the present invention are intended to be illustrative only. Numerous alternative embodiments may be devised by persons skilled in the art without departing from the scope of the following claims.

What is claimed is:

1. A method of separating a semiconductor layer from a substrate, comprising steps of:
    forming a column matrix on a substrate comprising steps of:
        disposing a mask on said substrate;
        annealing said mask to form a plurality of covering portions;
        etching said substrate by using said covering portions to form a plurality of columns on said substrate, wherein said columns of said column matrix are separated from each other; and
        separating said covering portions from said substrate;
    growing a semiconductor layer on said substrate with said column matrix; and
    wet etching said column matrix to separate said semiconductor layer from said substrate.

2. The method of claim 1, wherein the step of annealing is performed by a rapid thermal annealing process.

3. The method of claim 1, wherein said mask comprises one of a nickel layer, a silver layer, and a platinum layer.

4. The method of claim 3, wherein said mask further comprises a $Si_3N_4$ layer, wherein said $Si_3N_4$ layer is located on said substrate and said nickel layer, said silver layer, or said platinum layer is disposed on said $Si_3N_4$ layer.

5. The method of claim 1, wherein said step of etching said substrate by using said covering portions to form said plurality of columns uses inductively coupled plasma reactive ion etching process.

6. The method of claim 1, wherein the distribution densities of said plurality of columns and said plurality of covering portions are approximately between $2.2 \times 10^9$ cm$^{-2}$ and $3 \times 10^{10}$ cm$^{-2}$, and the size of said column matrix is substantially 50-300 nm.

7. The method of claim 1, wherein prior to said step of etching said column matrix to separate said semiconductor layer from said substrate, the method further comprises steps of:
    forming a metallic mirror layer on said semiconductor layer;
    disposing a conductive material on said metallic mirror layer; and
    forming an etching protective layer to cover said semiconductor layer, said metallic mirror layer and said conductive material.

8. The method of claim 7, wherein prior to said step of forming said metallic mirror layer on said semiconductor layer further comprises forming an optoelectronic compound device on said semiconductor layer so that said optoelectronic compound device located between said metallic mirror layer and said semiconductor layer.

9. The method of claim 1, wherein said step of etching said substrate is performed by using etchant injected into the void of said column matrix.

10. The method of claim 9, after said step of wet etching said column matrix to separate from said semiconductor layer and said substrate further comprising a step of recovering etched surface of said semiconductor layer.

11. The method of claim 10, wherein said step of recovering said etched surface of said semiconductor layer comprises dry etching, wet etching, chemical mechanical polishing (CMP), or a combination thereof.

12. The method of claim 1, wherein material of said semiconductor layer includes GaN, GaInN, or AlGaN, or a combination thereof.

13. The method of claim 1, said substrate comprising sapphire, ZnO, quartz, silica-based semiconductor material, group III-V semiconductor material, or group II-VI semiconductor material.

* * * * *